United States Patent
Miyazaki et al.

(10) Patent No.: US 10,892,065 B2
(45) Date of Patent: Jan. 12, 2021

(54) METHOD FOR FORMING METAL PATTERN, AND ELECTRIC CONDUCTOR

(71) Applicants: TANAKA KIKINZOKU KOGYO K.K., Tokyo (JP); NATIONAL INSTITUTE OF ADVANCED INDUSTRIAL SCIENCE AND TECHNOLOGY, Tokyo (JP)

(72) Inventors: Satoshi Miyazaki, Tsukuba (JP); Yuichi Makita, Tsukuba (JP); Hitoshi Kubo, Tsukuba (JP); Tatsuo Hasegawa, Tsukuba (JP); Toshikazu Yamada, Nagoya (JP)

(73) Assignees: TANAKA KIKINZOKU KOGYO K.K., Tokyo (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 278 days.

(21) Appl. No.: 15/506,586

(22) PCT Filed: Aug. 19, 2015

(86) PCT No.: PCT/JP2015/073196
§ 371 (c)(1),
(2) Date: Feb. 24, 2017

(87) PCT Pub. No.: WO2016/031641
PCT Pub. Date: Mar. 3, 2016

(65) Prior Publication Data
US 2017/0256332 A1  Sep. 7, 2017

(30) Foreign Application Priority Data
Aug. 27, 2014 (JP) .................................. 2014-172347

(51) Int. Cl.
*H05K 3/10* (2006.01)
*H01B 5/14* (2006.01)
(Continued)

(52) U.S. Cl.
CPC .................. *H01B 5/14* (2013.01); *B05D 1/32* (2013.01); *B05D 1/42* (2013.01); *B05D 3/007* (2013.01);
(Continued)

(58) Field of Classification Search
CPC . B05D 1/32; B05D 1/42; B05D 3/007; B05D 3/063; B05D 5/12; B05D 7/04;
(Continued)

(56) References Cited

U.S. PATENT DOCUMENTS

2003/0148024 A1* 8/2003 Kodas .................... C23C 18/06
427/125

FOREIGN PATENT DOCUMENTS

JP         7-207450 A      8/1995
JP         H07-207450 A    8/1995
(Continued)

OTHER PUBLICATIONS

Niino, JP 2002146066-A, machine translation, originally published 2002, p. 1-8 (Year: 2002).*

(Continued)

*Primary Examiner* — Katherine A Bareford
*Assistant Examiner* — Christian D McClure
(74) *Attorney, Agent, or Firm* — Orrick, Herrington & Sutcliffe LLP; Joseph A. Calvaruso; K. Patrick Herman

(57) ABSTRACT

The present invention provides a method for forming a metal pattern on a pattern formation section set in a part or the whole of a region on a base material, the base material including a fluorine-containing resin layer on a surface including at least the pattern formation section, the method
(Continued)

including the step of: forming a functional group on a pattern formation section of the fluorine-containing resin layer by a treatment such as ultraviolet-ray irradiation, then applying to the surface of the base material a metal fine particle dispersion liquid in which metal fine particles protected by an amine compound as a first protective agent and a fatty acid as a second protective agent are dispersed in a solvent, and fixing the metal fine particles on the pattern formation section.

12 Claims, 3 Drawing Sheets

(51) Int. Cl.
| | | |
|---|---|---|
| B05D 7/24 | (2006.01) | |
| H01B 1/22 | (2006.01) | |
| H05K 1/09 | (2006.01) | |
| H01B 1/00 | (2006.01) | |
| H01B 13/00 | (2006.01) | |
| B05D 5/12 | (2006.01) | |
| B32B 15/082 | (2006.01) | |
| B05D 1/32 | (2006.01) | |
| B05D 1/42 | (2006.01) | |
| B05D 3/00 | (2006.01) | |
| B05D 3/06 | (2006.01) | |
| B05D 7/04 | (2006.01) | |

(52) U.S. Cl.
CPC .............. *B05D 3/063* (2013.01); *B05D 5/12* (2013.01); *B05D 7/04* (2013.01); *B05D 7/24* (2013.01); *B32B 15/082* (2013.01); *H01B 1/00* (2013.01); *H01B 1/22* (2013.01); *H01B 13/00* (2013.01); *H05K 1/09* (2013.01); *H05K 3/10* (2013.01)

(58) Field of Classification Search
CPC ........ B05D 7/24; B32B 15/082; H01B 13/00; H01B 5/14; H01B 1/22; H01B 1/00; H05K 1/09; H05K 3/10
See application file for complete search history.

(56) References Cited

FOREIGN PATENT DOCUMENTS

| | | | |
|---|---|---|---|
| JP | 2002146066 A | * | 5/2002 |
| JP | 2003-123543 A | | 4/2003 |
| JP | 2004-296424 A | | 10/2004 |
| JP | P2009-600 A | | 1/2009 |
| JP | 2013-133488 A | | 7/2013 |

OTHER PUBLICATIONS

Polymer Science Learning Center, "Polytetrafluoroethylene", 2019, p. 1-6 (Year: 2019).*
PCT, International Search Report for PCT/JP2015/073196, dated Nov. 24, 2015.
EP, Extended Search Report for EP application No. 15836285.5, dated Apr. 6, 2018.

* cited by examiner

MICROSCOPIC PHOTOGRAPH

SEM PHOTOGRAPH

METHOD FOR FORMING METAL PATTERN, AND ELECTRIC CONDUCTOR

TECHNICAL FIELD

The present invention relates to a method for forming a metal pattern on a surface of any base material, specifically a method capable of forming a fine metal pattern on a base material at low temperature with high efficiency by application of a dispersion liquid in which metal particles protected with a predetermined protective agent.

BACKGROUND ART

With an increase in density of semiconductor devices and an increase in size of screens of displays and touch panels, wiring and electrode circuits to be used in these devices have required a process capable of forming a pattern which is made finer than ever and has a large area.

Various kinds of requirements for the devices have become urgent to the extent of suggesting necessity to change materials to be applied. For wiring patterns for touch panels, for example, transparent electrode materials such as ITO have been heretofore applied, but an increase in size of panels has been demanded, for example, and ITO has been no longer able to satisfy the requirement. Specifically, for achieving an increase in size of panels, the resistance value of wiring should be reduced for coping with an increase in wiring length. Since intrinsically, ITO is not a material having low electric resistance, the thickness should be increased for reducing the resistance value, and this may deteriorate transparency, and thus make the material useless as a transparent electrode. A reduction in weight per unit area has been increasingly required in response to an increase in size of panels, and therefore an attempt is made to change a substrate material to resin from glass that has been heretofore used. However, in a step of forming an ITO electrode, firing should be performed at about 300° C. after a substrate is coated, and a resin substrate cannot endure the firing temperature. Accordingly, it is indicated that there is a limitation on use of ITO from the viewpoint of weight reduction.

In view of the example of touch panels, an attempt is made to apply extremely thin and dense highly fine patterns composed of metals such as copper and silver as various kinds of electrode and wiring materials. These metals have good electric conductivity, and can easily satisfy the requirement for the resistance value associated with an increase in area of wiring patterns. When such a metal is formed into fine particles, and dispersed in an appropriate solvent, and the dispersion is applied, a desired shape and pattern can be formed. By performing heating at relatively low temperature after the application, the metal can be aggregated and sintered to form a metal film. Thus, a substrate material can be selected from a wide range of materials. Further, these metals are not transparent, but when they are formed into thin lines in a micron order beyond a visible region for humans, light transmissivity comparable to that of a transparent electrode is exhibited.

Here, examples of the method for forming a metal pattern include techniques described in Patent Document 1 and Patent Document 2. In the method described in Patent Document 1, a pattern is formed by use of a liquid called a functional liquid, which contains an electrically conductive material for forming a pattern. In this method, a substrate having lyophilic portions for the functional liquid is provided, droplets containing a material serving as a liquid-repellant material for the functional liquid are discharged and applied to the substrate to form liquid-repellant portions, and the functional liquid is discharged to the lyophilic portions between the formed liquid-repellant portions to form a pattern of the electrically conductive material.

In the method described in Patent Document 2, a coating fluid for forming an electrically conductive layer, which fluid contains precious metal fine particles is used to form a pattern. In this method, water-repellant transparent layers in a predetermined pattern are formed on a substrate, and the coating liquid for forming an electrically conductive layer is applied to spaces between the water-repellant transparent layers, and dried to form a pattern. Uniform water-repellant transparent layers are formed on the substrate, water-repellant vanishing portions in a predetermined pattern are formed on surfaces of the water-repellant transparent layers, and the coating fluid for forming an electrically conductive layer is then applied and dried to form a pattern. In these techniques, an organic polymer resin as a resist can be applied in a desired pattern shape, and etched to form water-repellant transparent layers and water-repellant vanishing portions.

RELATED ART DOCUMENT

Patent Documents

Patent Document 1: JP2009-600 A
Patent Document 2: JP2003-123543 A

SUMMARY OF THE INVENTION

Problems to be Solved by the Invention

However, in the technique described in Patent Document 1, formation of liquid-repellant portions and application of a functional liquid are performed by a so-called ink-jet method. In the ink-jet method, a liquid is discharged through nozzles, and a liquid containing electrically conductive particles like a functional liquid may cause clogging of nozzle holes, so that it is difficult to stably form an extremely thin line pattern. In the ink-jet method, a desired pattern is formed by movement and scanning of nozzles, and it is difficult to achieve both finning and an increase in area for a metal pattern.

A method for forming a pattern by photolithography that generally involves used of a resist as in the technique described in Patent Document 2, the number of steps increases because of the treatment of the resist, so that efficiency is reduced to increase cost.

When a base material is changed from a hard material such as glass or ceramic to a soft material such as resin or plastic in response to weight reduction of devices or the like, a metal pattern may be peeled and damaged due to deformation of a substrate. Therefore, it is predicted that in the future, a higher bonding strength between the base material and the metal pattern will be required than before. In this respect, in the methods for forming a metal pattern, pattern formation sections of a substrate are lyophilic or hydrophilic, but this is intended to retain an applied liquid in the portions, and does not act to improve bondability between a metal component and a base material in the liquid. Accordingly, in the conventional arts, it may be difficult to obtain bonding that is firm enough for the patter to follow deformation of the base material.

Thus, the present invention proposes a method for forming a metal pattern on a base material, the method being capable of efficiently producing a highly fine metal pattern. In this object, the present invention aims to ensure that the metal pattern can be formed at relatively low temperature, and firmly bonded to the base material.

Means for Solving the Problems

Use of a dispersion liquid as applied in the conventional arts, i.e. a dispersion liquid in which metal fine particles are dispersed, is preferred in that a pattern is formed at low temperature, and when such a liquid is used, it may be advantageous that a non-pattern formation section of a surface of a base material is water-repellent. What matters are a method for easily forming a region to which a dispersion liquid is applied to fix metal fine particles, and a method for increasing a bonding strength between each metal fine particle and a base material. The present inventors have thought that improvement of both the treatment of the base material and the dispersion liquid in which metal fine particles dispersed is the most advantageous. The present inventors have extensively conducted studies, and arrived at the present invention.

The present invention provides a method for forming a metal pattern on a pattern formation section set in a part or the whole of a region on a base material, the base material including a fluorine-containing resin layer on a surface including at least the pattern formation section, the method including the step of: forming a functional group on a pattern formation section of the fluorine-containing resin layer, then applying to the surface of the base material a metal fine particle dispersion liquid in which metal fine particles protected by an amine compound as a first protective agent and a fatty acid as a second protective agent are dispersed in a solvent, and fixing the metal fine particles on the pattern formation section.

The present invention has a feature in each of (1) selecting a base material having a liquid-repellent fluorine-containing resin layer; (2) performing a predetermined treatment of a surface of the base material; and (3) optimizing a configuration of a metal fine particle dispersion liquid as a treatment liquid for fixing metal particles on the base material, for making it possible to form a highly fine metal pattern. Here, the predetermined treatment of the surface of the base material in (2) means that a metal pattern formation section on a surface of a fluorine-containing resin is modified to form a functional group. A dispersion liquid containing metal particles to which a predetermined protective agent is bonded is brought into contact with the surface of the substrate as described in (3). Accordingly, a substitution reaction between the protective agent for the metal particles and the functional group on the surface of the base material occurs at the metal pattern formation section, and the metal particles are bonded to the surface of the base material via the functional group. In the present invention, one having a fluorine-containing resin layer is applied as the base material as described in (1). Thus, the surface of the base material which has no functional group retains water-repellency, so that the dispersion liquid is repelled.

In the present invention, a selective bonding action of metal particles to a portion provided with a functional group as described above makes it possible to form a metal pattern by spreading a metal fine particle dispersion liquid over a surface of a base material. This method is more efficient than a method in which a metal pattern is formed by drawing like an ink-jet method. A resist is not necessary, and therefore the number of steps can be reduced. As described later, a functional group can be formed by, for example, ultraviolet-ray irradiation, and therefore a pattern with a very small width is easily formed.

Hereinafter, the features of the present invention will be described in detail. In the present invention, first, a base material having a fluorine-containing resin layer on its surface is applied. Here, the constituent material for the base material is not particularly limited. A base material made of metal or a base material made of glass or ceramic can be applied. A base material made of resin or plastic can also be applied. Resin, plastic or the like can be applied without problems because a metal pattern can be formed at low temperature in the present invention as described later. The region in which a metal pattern is formed on the base material may be set in the whole or a part of the surface of the base material, or may be set in a plurality of portions on the base material.

The fluorine resin layer may be one formed on one of the various kinds of base materials beforehand. As one step of forming a metal pattern, the metal pattern may be formed on a base material with no fluorine resin layer by, for example, application. As long as the fluorine resin layer encompasses a pattern formation section, the fluorine resin layer may be formed on the whole or a part of a surface of the base material. The thickness of the fluorine-containing resin layer is not particularly limited. Generally, when the fluorine-containing resin layer is applied with a thickness of 0.01 μm or more, liquid-repellency can be exhibited. The upper limit of the thickness is not particularly limited, but when transparency is required, the upper limit of the thickness is about 5 μm.

As the fluorine-containing resin, a fluorine-containing resin being a polymer having one or more kinds of repeating units based on a fluorine-containing monomer containing fluorine atoms can be applied. The fluorine-containing resin may be one having one or more kinds of repeating units based on a fluorine-containing monomer and one or more kinds of repeating units based on a non-fluorine-containing monomer which does not contain fluorine atoms. The fluorine-containing resin in the present invention may contain hetero atoms such as oxygen, nitrogen and chlorine atoms in a part of the fluorine-containing resin.

Specific examples of the fluorine-containing resin include polytetrafluoroethylene (PTFE), polychlorotrifluoroethylene (PCTFE), polyvinylidene fluoride (PVDF), polyvinyl fluoride (PVF), tetrafluoroethylene-perfluoroalkyl vinyl ether copolymers (PFA), tetrafluoroethylene-hexafluoropropylene copolymers (FEP), ethylene-tetrafluoroethylene copolymers (ETFE), ethylene-chlorotrifluoroethylene copolymers (ECTFE), tetrafluoroethylene perfluorodioxol copolymers (TFE/PDD), and fluorine-containing resins having a cyclic perfluoroalkyl structure or a cyclic perfluoroalkyl ether structure.

From the viewpoint of liquid-repellency, a fluorine-containing resin composed of a polymer having at least one kind of repeating units in which the ratio (F/C) of the number of fluorine atoms to the number of carbon atoms is 1.0 or more, regarding repeating units based on a fluorine-containing monomer that forms a polymer, is preferable as a fluorine-containing resin to be used in the present invention. The ratio F/C in the repeating unit based on the fluorine-containing monomer is more preferably 1.5 or more. The upper limit of the ratio F/C is preferably 2.0 from the viewpoint of liquid-repellency and ease of acquisition. The fluorine-containing resin that is particularly preferable regarding this requirement is a perfluoro resin having repeating units based on a perfluoro compound monomer, and in the perfluoro resin, the ratio F/C in the repeating unit is 1.5 or more.

A preferred fluorine-containing resin can be selected with consideration given to application of a transparent base material and characteristics of a metal pattern in addition to liquid-repellency. For example, when consideration is given to solubility in a solvent for forming a fluorine-containing resin layer, a perfluoro resin having a cyclic structure on the main chain is preferable as the fluorine-containing resin. When the fluorine resin layer is required to have transparency, it is more preferable to apply a noncrystalline perfluoro resin. Examples of the preferable fluorine-containing resin with consideration given to these characteristics include perfluorobutenyl vinyl ether polymer (CYTOP (registered trademark): ASAHI GLASS CO., LTD.), a tetrafluoroethylene-perfluorodioxol copolymer (TFE-PDD), and Teflon (registered trademark) AF: Du Pont-Mitsui Fluorochemicals Company, Ltd.).

In the present invention, formation of a functional group on a pattern formation section of the fluorine resin layer is required, and examples of the treatment for formation of a functional group include ultraviolet-ray irradiation as described later. Examples of the means for forming a highly fine pattern in such an operation of exposure to light energy include contact exposure. The present inventors have found that when a fluorine-containing resin is selected in the present invention, contact exposure can be favorably performed. As a specific requirement, a fluorine-containing resin including at least one oxygen atom in each of repeating units based on fluorine-containing monomer that forms the polymer is preferable. The reason for this is not known, but the present inventors suppose that when a fluorine-containing resin containing oxygen, the oxygen acts as a radical in the process of exposure, and contributes to formation of a functional group. Examples of the fluorine-containing resin containing oxygen include perfluorobutenyl vinyl ether polymer (CYTOP (registered trademark): ASAHI GLASS CO., LTD.), a tetrafluoroethylene-perfluorodioxol copolymer (TFE-PDD), and a tetrafluoroethylene-perfluoroalkyl vinyl ether copolymer (PFA).

A solution obtained by dissolving a fluorine-containing resin in an appropriate solvent can be applied for forming a fluorine resin layer on the base material. After the application, firing is performed to form a fluorine-containing resin layer. Examples of the method for applying a fluorine-containing resin include, but are not limited to, dipping, spin coating and roll coating. After the fluorine-containing resin is applied, a post-treatment (drying treatment or firing treatment) appropriate to the resin is performed to form a fluorine-containing resin layer.

Next, a functional group is formed on a surface of the fluorine-containing resin layer on the base material. The functional group is formed by cutting C—F bonds in the fluorine-containing resin. Specifically, a carboxy group, a hydroxy group or a carbonyl group is formed.

Examples of the method for treatment for forming a functional group on a surface of the fluorine-containing resin layer include ultraviolet-ray irradiation, corona discharge treatment, plasma discharge treatment and excimer laser irradiation. In these treatments, C—F bonds are cut by causing a photochemical reaction to occur on a surface of the fluorine-containing resin, and application of moderate energy is required. The approximate amount of applied energy to a pattern formation section is preferably not less than 1 mJ/cm$^2$ and not more than 4000 mJ/cm$^2$. For example, when the treatment is performed by ultraviolet-ray irradiation, irradiation with an ultraviolet ray having a wavelength of not less than 10 nm and not more than 380 nm is preferable, and irradiation with an ultraviolet ray having a wavelength of not less than 100 nm and not more than 200 nm is particularly preferable.

When a surface of the fluorine-containing resin layer is irradiated with an ultraviolet ray, generally an exposure treatment using a photomask (reticle) is performed. Regarding an exposure method in the present invention, either a non-contact exposure method (proximity exposure or projection exposure) or a contact exposure method (contact exposure) can be used. In proximity exposure, the distance between a mask and a surface of the fluorine-containing resin layer is preferably 10 µm or less, more preferably 3 µm or less.

A fluorine-containing resin layer is formed on a base material, and a treatment for formation of a functional group on a pattern formation section is performed in the manner described above, and the base material is brought into contact with a metal fine particle dispersion liquid. In the present invention, the configuration of the metal fine particle dispersion liquid is optimized for favorably forming a metal pattern. The metal fine particle dispersion liquid to be applied in the present invention is obtained by dissolving metal fine particles, to which a predetermined protective agent is bonded, in a solvent.

The metal fine particles correspond to a constituent material for a metal pattern to be formed. Preferably, the metal fine particles are composed of at least one of silver, gold, platinum, palladium, copper and alloys of these metals. These metals are excellent in electric conductivity and useful as, for example, an electrode material.

The average particle size of the metal fine particles is preferably not less than 5 nm and not more than 100 nm. The metal fine particles are required to have a particle size of 30 nm or less for forming a fine wiring pattern. However, excessively fine metal particles are easily aggregated, and are thus poor in handling characteristics.

The protective agent suppresses aggregation and coarsening of metal fine particles to stabilize the dispersion state. Aggregation and coarsening of metal fine particles not only causes precipitation of metal in storage and use of the dispersion liquid, but also influences sintering characteristics after bonding of the metal fine particles to the base material, and therefore must be avoided. In the present invention, the protective agent substitutes for the functional group on a surface of the base material (fluorine-containing resin layer) to act as a marker for fixing the metal. The protective agent for metal particles in the present invention includes an amine as a first protective agent, and a fatty acid as a second protective agent. In the present invention, two types of compounds having different basic structures are combined, and protect metal particles.

The total carbon number of the amine compound that is the first protective agent is preferably not less than 4 and not more than 12. The carbon number of the amine influences stability of metal particles, and sintering characteristics in formation of a pattern. When an amine with a carbon number of less than 4 is used, it is difficult for metal fine particles to stably exist, so that formation of a uniform sintered body is difficult. When an amine with a carbon number of more than 12 is used, stability of metal particles is excessively enhanced, so that heating at a high temperature is required for formation of a pattern. Accordingly, an amine compound with a total carbon number of not less than 4 and not more than 12 is preferable as the protective agent in the present invention.

With regard to the number of amino groups in the amine compound that is the protective agent, a (mono)amine having one amino group or a diamine having two amino groups can be applied. The number of hydrocarbon groups bonded to the amino group is preferably 1 or 2. In other words, a primary amine ($RNH_2$) or a secondary amine ($R_2NH$) is preferable. When a diamine is applied as the protective agent, it is preferable that at least one amino group is a primary amine or a secondary amine. The hydrocarbon group bonded to the amino group may be a chain hydrocarbon having a linear structure or a branched structure, or a hydrocarbon group having a cyclic structure. The hydrocarbon group may contain oxygen in part. Preferred specific examples of the protective agent to be applied in the present invention include the following amine compounds. To adjust dispersibility and low-temperature sintering characteristics of metal particles in the dispersion liquid, a plurality of amine compounds may be mixed/combined, and used as the amine compound that is the first protective agent. As long as the first protective agent includes at least one amine compound with a total carbon number of not less than 4 and not more than 12, an amine compound with a carbon number falling out of the range may exist.

TABLE 1

| Total carbon number | Preferred amine compounds |
|---|---|
| C4 | butylamine, 1,4-diaminobutane, 3-methoxypropylamine |
| C5 | pentylamine, 2,2-dimethylpropylamine, 3-ethoxypropylamine, N,N-dimethyl-1,3-diaminopropane |
| C6 | hexylamine |
| C7 | heptylamine, benzylamine, N,N-diethyl-1,3-diaminopropane |
| C8 | octylamine, 2-ethylhexylamine |
| C9 | nonylamine |
| C10 | decylamine, diaminodecane |
| C11 | undecylamine |
| C12 | dodecylamine, diaminododecane |

The fatty acid to be applied as the second protective agent enhances stability of metal fine particles by acting as an auxiliary protective agent for the amine compound in the dispersion liquid. The effect of the fatty acid is evidently exhibited after metal particles are applied to the base material, and a metal pattern having a uniform thickness can be formed by adding the fatty acid. This effect can be clearly understood by comparison with a case where fatty acid-free metal fine particles are applied. A stable metal pattern cannot be formed with fatty acid-free metal fine particles.

The fatty acid is preferably an unsaturated or saturated fatty acid with a carbon number of not less than 4 and not more than 20. An unsaturated or saturated fatty acid with a carbon number of 3 or less deteriorates dispersibility of metal fine particles in a dispersion medium, so that the metal fine particles are easily aggregated, thus making it difficult to form a stable metal pattern. An unsaturated or saturated fatty acid with a carbon number of more than 20 generally has a low vapor pressure and is thus hardly evaporated, and therefore cannot be sufficiently removed from metal fine particles in formation of a metal pattern. Accordingly, the resistance value of the metal pattern tends to increase.

Specific examples of the preferable fatty acid include saturated fatty acids such as butanoic acid (carbon number: 4), pentanoic acid (carbon number: 5), hexanoic acid (carbon number: 6), heptanoic acid (carbon number: 7), octanoic acid (carbon number: 8), nonanoic acid (carbon number: 9), decanoic acid (another name: capric acid, carbon number: 10), undecanoic acid (another name: undecylic acid, carbon number: 11), dodecanoic acid (another name: lauric acid, carbon number: 12), tridecanoic acid (another name: tridecylic acid, carbon number: 13), tetradecanoic acid (another name: myristic acid, carbon number 14), pentadecanoic acid (another name: pentadecylic acid, carbon number: 15), hexadecanoic acid (another name: palmitic acid, carbon number: 16), heptadecanoic acid (another name: margaric acid, carbon number: 17), octadecanoic acid (another name: stearic acid, carbon number: 18), nonadecanoic acid (another name: nonadecylic acid, carbon number 19) and eicosanoic acid (another name: arachidic acid, carbon number: 20); and unsaturated fatty acids such as palmitoleic acid (carbon number: 16), oleic acid (carbon number: 18), linolic acid (carbon number: 18), linolenic acid (carbon number: 18) and arachidonic acid (carbon number: 20). Oleic acid, linolic acid, stearic acid, lauric acid and butanoic acid are particularly preferable. A plurality of fatty acids may be combined, and used as the above-described fatty acid that is the second protective agent. As long as the second protective agent includes at least one unsaturated or saturated fatty acid with a total carbon number of not less than 4 and not more than 20, other fatty acid may exist.

Metal fine particles protected by the first and second protective agents are dispersed in a solvent to form a metal fine particle dispersion liquid. The solvent applicable here is an organic solvent, and examples of the solvent include alcohol, benzene, toluene and alkanes. These solvents may be mixed. Examples of the preferable solvent include alkanes such as hexane, heptane, octane, nonane and decane; and alcohols such as methanol, ethanol, propanol, butanol, pentanol, hexanol, heptanol, octanol, nonanol and decanol. A mixed solvent of one or more alcohols and one or more alkanes each selected from the above-mentioned solvents.

The content of metal particles in the dispersion liquid is preferably not less than 20% by weight and not more than 60% by weight in terms of a ratio of the mass of metal to the mass of the dispersion liquid. When the content of metal fine particles in the dispersion liquid is less than 20%, a metal pattern with a uniform thickness for securing sufficient electric conductivity cannot be formed on a pattern formation section, and thus the resistance value of the metal pattern increases. When the content of metal fine particles in the dispersion liquid is more than 60%, formation of a stable metal pattern is difficult due to aggregation and expansion of metal fine particles. Accordingly, the content of metal particles in the dispersion liquid in the present invention is preferably not less than 20% by weight and not more than 60% by weight in terms of a ratio of the mass of metal to the mass of the dispersion liquid.

The content of the protective agent in the dispersion liquid is preferably not less than 0.01 to 0.32 in terms of a ratio ($mol_{amine}/mol_{metal}$) of the mol number of the amine ($mol_{amine}$) to the mol number of metal ($mol_{metal}$) in the dispersion liquid for the amine compound that is the first protective agent. The content of the fatty acid that is the second protective agent is preferably not less than 0.001 to 0.05 in terms of a ratio ($mol_{fatty\ acid}/mol_{metal}$) of the mol number of the fatty acid ($mol_{fatty\ acid}$) to the mol number of metal ($mol_{metal}$). Even when the content of the protective agent in the dispersion liquid is above the above-mentioned preferred range, dispersibility of metal particles is not influenced, but since an excessive amount of the protective agent influences the low-temperature sintering characteristics of metal particles and the resistance value of a metal pattern to be formed, the content of the protective agent is preferably in the above-mentioned range. When a plurality of amine compounds and fatty acids are used, the total mol number is applied as the molar number of each of the protective agents.

The metal fine particle dispersion liquid described above is applied to a base material having a fluorine-containing resin layer. For application of the metal fine particle dispersion liquid, dipping, spin coating or roll coating can be applied, but the metal fine particle dispersion liquid may be dropped, and spread by use of an application member such as a blade, a squeegee or a spatula. In the present invention, a functional group for selectively fixing metal particles is formed on a pattern formation section beforehand, so that a pattern can be efficiently formed by spreading the dispersion liquid at a time.

On a base surface of a fluorine-containing resin which has no functional group, the metal fine particle dispersion liquid is repelled due to liquid-repellence of the surface. When an application member such as a blade is used, the repelled dispersion liquid is removed from a surface of the base material. On a pattern formation section provided with a functional group, a substitution reaction of the protective agent for metal fine particles with the metal particles occurs, so that the metal fine particles are fixed on the base material. Thereafter, the solvent in the dispersion liquid is volatilized, and the metal fine particles on the base material are self-sintered to form a metal film, leading to formation of a metal pattern.

Since the self-sintering is a phenomenon that occurs even at room temperature, heating of the base material is not an essential step in formation of a metal pattern. When the metal pattern after self-sintering is fired, the protective agent (amine compound and fatty acid) remaining in the metal film can be completely removed, so that the resistance value can be reduced. Preferably, the firing treatment is performed at a temperature of not lower than 40° C. and not higher than 250° C. A temperature of lower than 40° C. is not preferable because it takes a long time for desorption and volatilization of the protective agent. When the temperature is higher than 250° C., the resin base material or the like may be deformed. The firing time is preferably not less than 10 minutes and not more than 120 minutes. The firing step may be carried out in an air atmosphere, or in a vacuum atmosphere.

A metal pattern composed of metal is formed by the above-mentioned application of a metal fine particle dispersion liquid, self-sintering of metal fine particles and firing as necessary.

An electric conductor having on a substrate the metal pattern formed by the method according to the present invention includes a highly fine metal pattern having preferred electric characteristics. The electric conductor according to the present invention includes: a base material with a pattern formation section set in a part or the whole of a region of the base material; a fluorine resin layer formed on at least a surface of the base material which includes the pattern formation section; and a metal pattern formed by fixing metal fine particles on the pattern formation section of the fluorine resin layer, wherein a functional group is formed on the pattern formation section.

Particularly, when the base material is composed of a transparent body, the electric conductor according to the present invention, which has a highly fine metal pattern, can be made to act as a transparent electric conductor, and can be expected to be applied to displays and touch panels.

Advantageous Effects of the Invention

By a metal pattern formation method according to the present invention, a highly fine metal pattern can be efficiently formed. Since the metal pattern is formed of a metal film, the metal pattern has a low resistance value, and can be suitably used as an electrode and wiring. In the present invention, a metal pattern can be formed through a relatively simple step of forming a functional group on a base material, followed by applying/printing a metal fine particle dispersion liquid. The present invention provides a method that is more convenient than a photolithography method generally using a resist, and more efficient than an ink-jet method.

According to the present invention, a fine and highly vivid metal pattern can be formed. The metal pattern can exhibit light-transmissivity comparable to that of a transparent electrode. Thus, a transparent electric conductor can also be produced by forming a metal pattern on a transparent base material by use of the method according to the present invention.

DESCRIPTION OF EMBODIMENTS

First Embodiment

Figure 1:
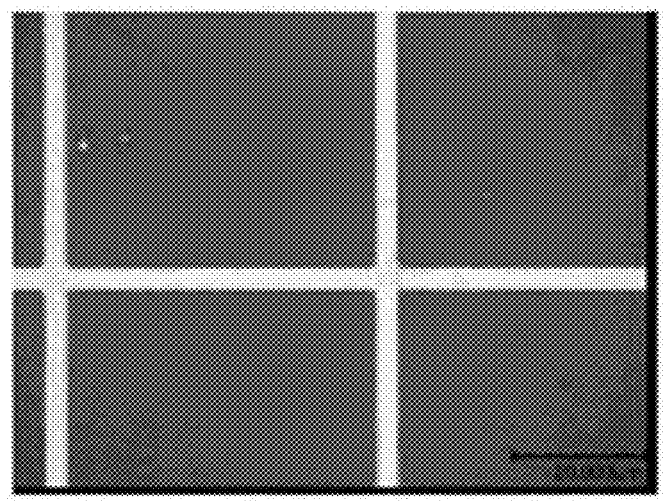
FIG. 1 shows photographs of an external appearance of a metal pattern formed in a first embodiment.
Figure 1:
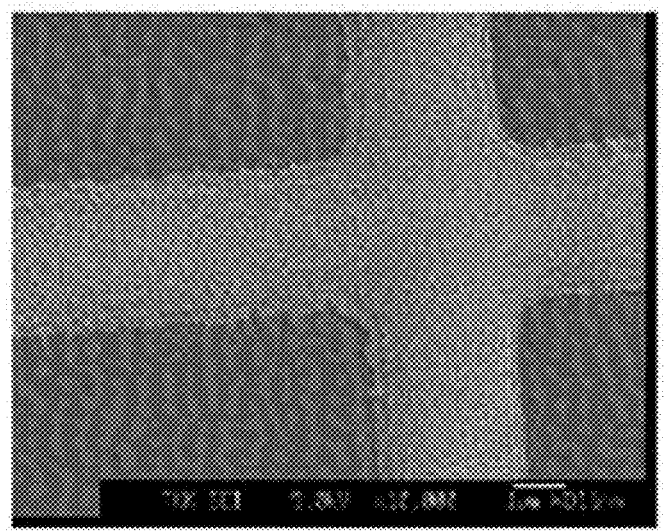

Hereinafter, a preferred embodiment of the present invention will be described. In this embodiment, formation of a fluorine-containing resin layer and formation of a functional group were performed as a pretreatment of a base material, a dispersion liquid with silver fine particles dispersed as metal particles was formed, and the dispersion liquid was applied to form a metal pattern.

[Provision of Base Material and Formation of Fluorine-Containing Resin Layer]

A resin substrate (size: 20 mm×20 mm) composed of polyethylene naphthalate was provided as a base material. A noncrystalline perfluorobutenyl ether polymer (CYTOP (registered trademark): manufactured by ASAHI GLASS CO., LTD.) as a fluorine-containing resin was applied to the resin substrate by a spin coating method (rotation number: 2000 rpm, 20 sec), then heated at 50° C. for 10 minutes, and subsequently at 80° C. for 10 minutes, and further heated in an oven at 100° C. for 60 minutes to be fired. Accordingly, a 1 µm-thick fluorine-containing resin layer was formed.

[Pretreatment of Base Material]

Next, a photomask having a lattice pattern (line width: 3 µm, line interval: 50 µm) was brought into close contact with the substrate provided with the fluorine-containing resin layer, and this was irradiated with an ultraviolet ray (VUV light) (contact exposure with a mask-substrate distance of 0). The VUV light was applied at 11 mW/cm$^{-2}$ with a wavelength of 172 nm for 20 seconds.

[Production and Application of Silver Fine Particle Dispersion Liquid]

In production of a silver fine particle dispersion liquid, silver particles were produced by a thermal decomposition method with a silver complex as a precursor. The thermal decomposition method uses as a starting material a thermally decomposable silver compound such as silver oxalate ($Ag_2C_2O_4$), and includes reacting the silver compound with a protective agent to form a silver complex, and heating and decomposing the silver complex as a precursor to prepare silver particles.

In this embodiment, silver particles were produced with silver oxalate as a raw material. N,N-dimethyl-1,3-diaminopropane as an amine serving as a protective agent was mixed with silver oxalate wetted with decane beforehand, so that a silver oxalate-amine complex as a precursor was produced. The added amount of N,N-dimethyl-1,3-diaminopropane was 0.76 (mol/mol) with respect to silver. To this were added two amine compounds: hexylamine and dodecylamine, and oleic acid was added as the second protective agent, and then oleic acid as the second protective agent, and the mixture was mixed. The added amount of hexylamine was 1.14 (mol/mol) with respect to silver, the added amount of dodecylamine was 0.095 (mol/mol) with respect to silver, and the added amount of oleic acid was 0.012 (mol/mol) with respect to silver. Addition of hexylamine and dodecylamine subsequent to addition of N,N-dimethyl-1,3-diaminopropane is intended to suppress aggregation by complementing the effect of protecting silver particles by N,N-dimethyl-1,3-diaminopropane.

Thereafter, the mixture was heated and stirred at 110° C. to decompose the complex. The heating and stirring caused the mixture to gradually turn from cream to brown, and finally turn to black. Bubbles (carbon dioxide) were generated during heating and stirring, and the reaction was ended at the time when bubbles disappeared.

After the end of the reaction, methanol was added, the mixture was stirred, and centrifugally separated, and the supernatant liquid was removed. The residue was washed with methanol to prepare silver fine particles. By the washing and centrifugal separation, an excess amine compound can be removed from silver fine particles to prepare silver particles including a protective agent in a preferred range.

To the silver fine particles was added a mixed solvent of octane and butanol (octane:butanol=4:1) to prepare a silver fine particle dispersion liquid. The silver concentration of the silver fine particle dispersion liquid was 40% by weight.

The silver fine particle dispersion liquid thus produced was applied to a substrate. The application was performed by spreading the dispersion liquid over a contact part between the substrate and a blade (made of glass), and then sweeping the blade in one direction. Here, the sweep rate was 2 mm/sec. It was confirmed that the dispersion liquid was deposited only on an ultraviolet-ray-irradiated portion (functional group-formed portion) of the substrate by the application using the blade. The dispersion liquid was naturally dried at room temperature (25° C.) to form a metal pattern.

The external appearance of the formed metal pattern was observed. The result is shown in FIG. 1, and it is apparent that in this embodiment, a pattern composed of a silver film with a clear line width of 3 μm is formed.

Figure 2:
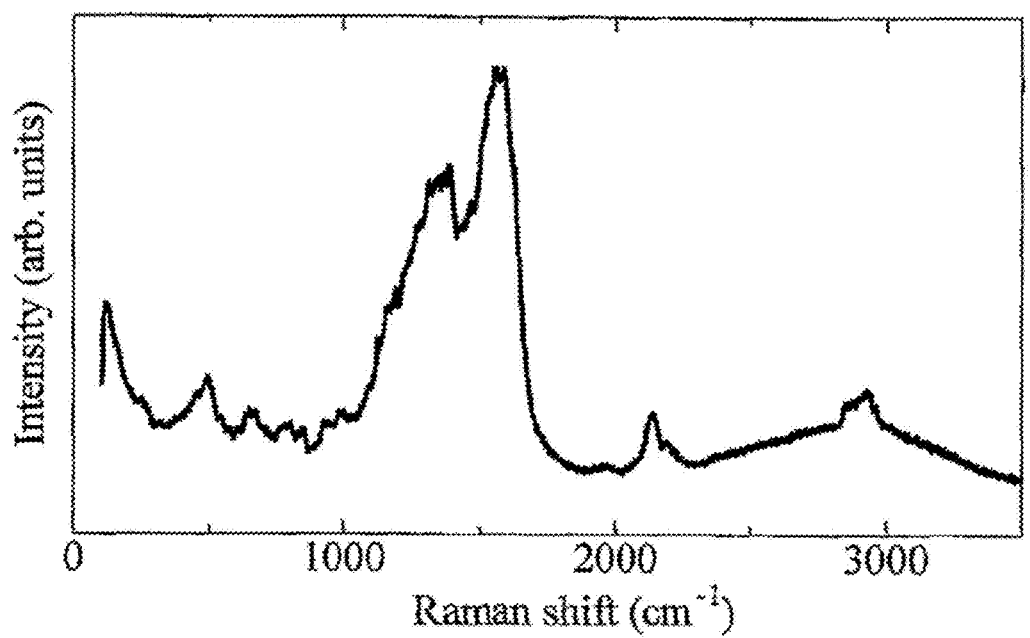
FIG. 2 shows a Raman spectrum at an interface, which is measured from the back surface of a substrate for the metal pattern in the first embodiment.

Next, the elementary coupling state of a metal pattern formation section of a surface of the substrate was examined by Raman microspectroscopic analysis. In this analysis, a metal pattern on a surface of a substrate is irradiated with laser light (wavelength: 532 nm) from the back surface of the substrate, and a Raman spectrum for the interface between a silver particle layer and a fluorine-containing resin layer is measured and analyzed to examine chemical species. FIG. 2 shows a Raman spectrum at the interface in laser irradiation from the back surface of the substrate. FIG. 2 shows that in the Raman spectrum measured in irradiation from the back surface, oscillatory structures near 1370 $cm^{-1}$ and near 1570 $cm^{-1}$ were observed as unique oscillatory structures that would not be observed when laser irradiation was performed from a surface of the substrate which was measured beforehand. It is considered that the oscillatory structures originated from a COO bond. Thus, it was confirmed that in this embodiment, a carboxy group was formed as a functional group on a surface of the fluorine-containing resin layer.

The resistance value was measured for the metal pattern, and the result showed that the surface resistance was 280Ω/□, and the volume resistance was 68 μΩ·cm. Comparison of the resistance value with a reference range (not less than 200Ω/□ and not more than 400Ω/□) of the resistance value which is generally required for a transparent electrically conductive film to be used in a touch panel film shows that the resistance value in this embodiment is well acceptable for electric wiring.

The substrate was heated at 80° C. to fire the metal pattern. The resistance value was similarly measured, and the result showed that the surface resistance was 66Ω/□, and the volume resistance was 16 μΩ·cm. Thus, it was confirmed that the resistance value decreased after heating the substrate.

Second Embodiment

Here, silver particles were produced by a thermal decomposition method with other silver compound as a starting material, and a metal pattern was formed by use of a dispersion liquid of the silver particles. The silver particles were produced in the same manner as in the first embodiment except that silver carbonate was used in place of silver oxalate. Similarly to the first embodiment, N,N-dimethyl-1,3-diaminopropane was mixed with silver carbonate in a dry state to produce a silver carbonate-amine complex as a precursor. Thereafter, similarly to the first embodiment, hexyl amine, dodecyl amine and oleic acid were added and mixed. The mixing amounts (mixing ratios) of the amine compounds and oleic acid were the same as in the first embodiment. Thereafter, the mixture was heated and stirred at 110° C. to decompose the complex, and centrifugally separated and washed to prepare silver fine particles. To the silver fine particles was added a mixed solvent of octane and butanol (octane:butanol=4:1) to prepare a silver fine particle dispersion liquid. The silver concentration of the silver fine particle dispersion liquid was 40% by weight.

Under the same conditions as in the first embodiment, the silver fine particle dispersion liquid was applied to a substrate subjected to the same pretreatment as in the first embodiment, so that a metal pattern was formed. The resistance value of the metal pattern formed in this embodiment was 300Ω/□ for the surface resistance, and 80 μΩ·cm for the volume resistance. The resistance value of the metal pattern fired by heating the substrate at 80° C. was 80Ω/□ for the surface resistance, and 20 μΩ·cm for the volume resistance. Thus, it was confirmed that the metal pattern formed in the second embodiment was useful as electric wiring.

Third Embodiment

In this embodiment, technical significance of a fatty acid forming a protective agent with an amine was examined with regard to a protective agent for a silver fine particle dispersion liquid. In the same manner as in the process for production of a silver fine particle dispersion liquid in the first embodiment except that other fatty acid (stearic acid, butanoic acid or propanoic acid) was added instead of adding oleic acid, or a fatty acid was not added, silver particles were produced, and a dispersion liquid was produced. Thereafter, in the same manner as in the first embodiment, the silver fine particle dispersion liquid was applied to a substrate subjected to the same pretreatment as in the first embodiment, and was dried and fired to form a metal pattern. Thereafter, a surface of the substrate was observed to examine whether or not a pattern was formed.

value of 400Ω/□ or less were rated acceptable "○". Results for metal patterns formed from the metal fine particle dispersion liquids are shown in Table 2.

TABLE 2

| Metal fine particles | Raw materials | First protective agent | | Second protective agent | | Wiring width | Resistance value* | |
|---|---|---|---|---|---|---|---|---|
| | | Amine | $mol_{amine}/mol_{metal}$ | Fatty acid | $mol_{fatty\ acid}/mol_{metal}$ | | Just after formation | After heat treatment |
| Pt | Dinitrodiamine Pt salt | Decylamine | 0.306 | Oleic acid | 0.01 | 3 μm | ○ | ○ |
| Pd | Dinitrodiamine Pd salt | Decylamine | 0.310 | Oleic acid | 0.01 | 3 μm | ○ | ○ |
| Au | Au chloride acid salt | Hexylamine | 0.350 | Oleic acid | 0.01 | 3 μm | ○ | ○ |
| Cu | Cu acetate | Hexylamine | 0.400 | Oleic acid | 0.01 | 5 μm | ○ | ○ |

*Resistance value: 400 Ω/□ or less is rated "○"

Figure 3:
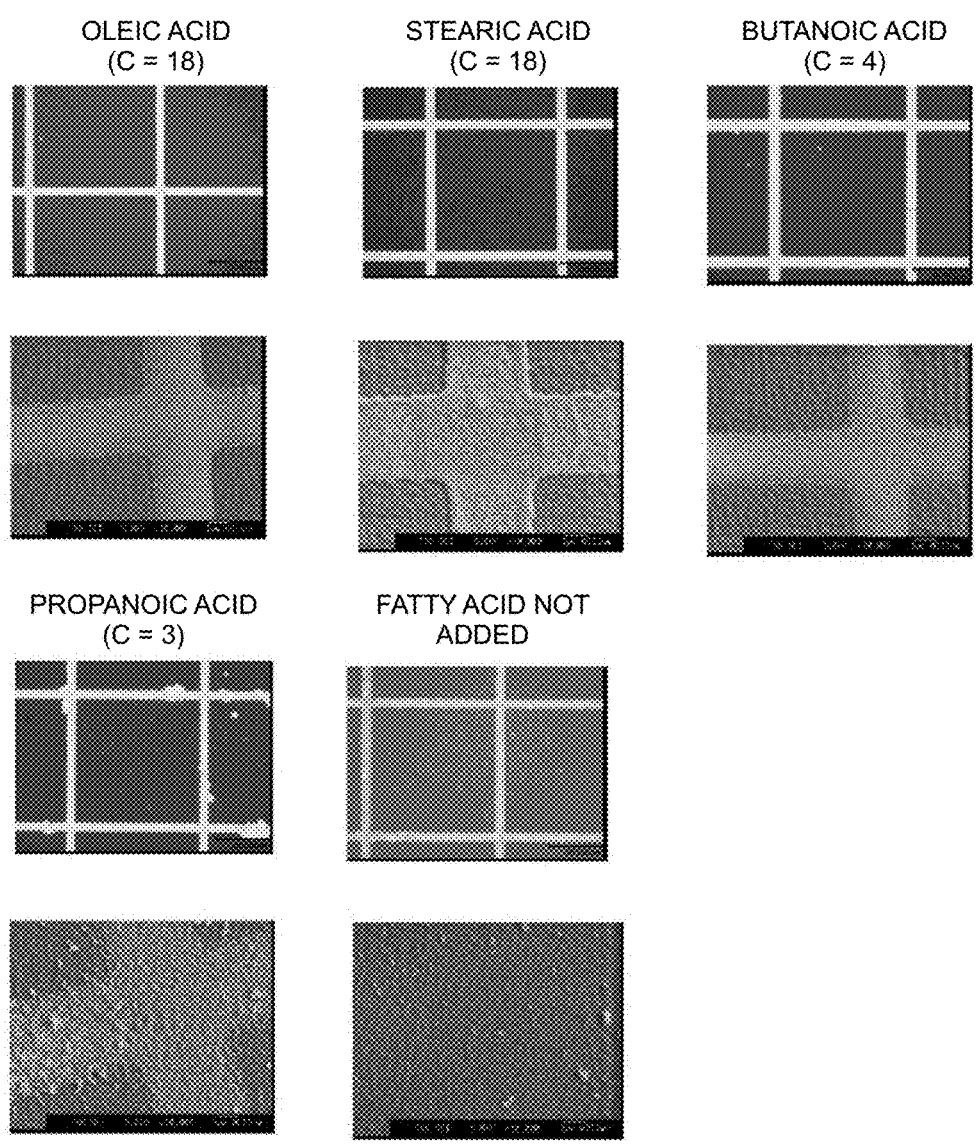
FIG. 3 shows photographs of external appearances of metal patterns formed of metal particles (silver particles) with various kinds of fatty acids as protective agents in a second embodiment.

The results are shown in FIG. 3. FIG. 3 shows that when a fatty acid is not added as a protective agent for silver fine particles, formation of a metal pattern is observed at a glance from a long distance, but aggregation of silver particles is observed in enlarged view. This state is substantially equivalent to occurrence of breakage, and the resistance value is extremely high. A similar phenomenon occurs when propanoic acid (carbon number: 3) being a fatty acid with a small carbon number is used as a protective agent. On the other hand, when the carbon number of the fatty acid is adjusted, and oleic acid, stearic acid or butanoic acid is used, the metal pattern becomes more vivid, so that a stable silver film is formed. Thus, it has been confirmed that application of a fatty acid as a protective agent for silver particles is required in use of a metal fine particle dispersion liquid for formation of a metal pattern.

Fourth Embodiment

In this embodiment, metal fine particle dispersion liquids with various kinds of metals applied as constituent materials for a metal pattern were produced, and each of the metal fine particle dispersion liquids was applied to a substrate to form a metal pattern.

In production of the metal fine particle dispersion liquid, a metal salt raw material of each of platinum, palladium, gold and copper was provided, the raw material was dissolved in a solvent (toluene or ethanol), an amine (hexylamine or decylamine) was added as a first protective agent, and a reducing agent (sodium borohydride) was added to reduce metal ions, thereby producing a mixed solution in which amine-protected metal fine particles were dispersed. Next, metal fine particles were separated and collected from the mixed solution, and washed, and toluene, to which oleic acid as a second protective agent was added beforehand, was added to produce a metal fine particle dispersion liquid.

The metal fine particle dispersion liquid was applied to a substrate. The configuration of the substrate, the pretreatment process and the application method are the same as in the first embodiment. In this embodiment, it was confirmed that the dispersion liquid was deposited only on a functional group-formed portion of the substrate by the application using the blade. The dispersion liquid was naturally dried at room temperature (25° C.) to form a metal pattern. The external appearance of the formed metal pattern was observed to measure the line width of the pattern. The resistance value was measured for the formed metal pattern. The resistance value was measured before and after heat treatment (80° C.), and metal patterns having a resistance From Table 2, it can be confirmed that from metal fine particle solutions of platinum, palladium, gold and copper, preferred metal patterns can be formed as in the case of silver. These metal patterns each had a sufficiently small line width, and an acceptable resistance value.

INDUSTRIAL APPLICABILITY

As described above, according to the present invention, an extremely fine metal pattern can be efficiently formed. The present invention is useful for formation of electrodes and wiring for various kinds of semiconductor devices, and also can be effectively applied for formation of wiring on a panel surface of a touch panel that is required to have light transmissivity.

The invention claimed is:
1. A method for forming a metal pattern comprising silver on a pattern formation section set in a part or the whole of a region on a base material,
the base material comprising a fluorine-containing resin layer on a surface including at least the pattern formation section,
the method comprising the steps of:
forming a functional group on a pattern formation section of the fluorine-containing resin layer, wherein the functional group is at least one of a carboxy group, a hydroxyl group, or a carbonyl group;
then applying to the surface of the base material a metal fine particle dispersion liquid in which metal fine particles consisting of silver and having an average particle size of not less than 5 nm and not more than 100 nm and protected by an amine compound as a first protective agent and a fatty acid as a second protective agent are dispersed in a solvent, wherein the fatty acid as a second protective agent includes at least one of oleic acid, stearic acid, linoleic acid, lauric acid and butanoic acid, and the ratio ($mol_{fatty\ acid}/mol_{metal}$) of the mol number of the fatty acid ($mol_{fatty\ acid}$) to the mol number of metal ($mol_{metal}$) is not less than 0.001 and not more than 0.05; and
fixing the metal fine particles on the pattern formation section by bonding the metal fine particles to the functional group.
2. The method for forming a metal pattern according to claim 1, wherein the fluorine-containing resin layer is composed of a polymer having at least one kind of repeating units in which the ratio (F/C) of the number of fluorine atoms to the number of carbon atoms is 1.0 or more as repeating units based on a fluorine-containing monomer that forms the polymer.

3. The method for forming a metal pattern according to claim 2, wherein in the step of forming a functional group on the surface of the fluorine-containing resin layer, energy of not less than 1 mJ/cm$^2$ and not more than 4000 mJ/cm$^2$ is applied to the pattern formation section of the surface of the fluorine-containing resin layer.

4. The method for forming a metal pattern according to claim 2, wherein the amine compound as the first protective agent includes at least one of amine compounds with a carbon number of not less than 4 and not more than 12.

5. The method for forming a metal pattern according to claim 2, wherein the solvent in the metal fine particle dispersion liquid is an alcohol solvent with a carbon number of not less than 3 and not more than 8, a hydrocarbon solvent with a carbon number of not less than 6 and not more than 10, or a mixture of these solvents.

6. The method for forming a metal pattern according to claim 2, comprising the step of: heating the base material at temperature of not lower than 40° C. and not higher than 250° C. after fixing metal fine particles on the pattern formation section.

7. The method for forming a metal pattern according to claim 1, wherein in the step of forming a functional group on the surface of the fluorine-containing resin layer, energy of not less than 1 mJ/cm$^2$ and not more than 4000 mJ/cm$^2$ is applied to the pattern formation section of the surface of the fluorine-containing resin layer.

8. The method for forming a metal pattern according to claim 1, wherein the amine compound as the first protective agent includes at least one of amine compounds with a carbon number of not less than 4 and not more than 12.

9. The method for forming a metal pattern according to claim 1, wherein the solvent in the metal fine particle dispersion liquid is an alcohol solvent with a carbon number of not less than 3 and not more than 8, a hydrocarbon solvent with a carbon number of not less than 6 and not more than 10, or a mixture of these solvents.

10. The method for forming a metal pattern according to claim 1, comprising the step of: heating the base material at temperature of not lower than 40° C. and not higher than 250° C. after fixing metal fine particles on the pattern formation section.

11. The method for forming a metal pattern according to claim 1, wherein the metal fine particles have an average particle size of not less than 5 nm and not more than 30 nm.

12. The method for forming a metal pattern according to claim 1, wherein a metal fine particle dispersion liquid having a content of not less than 0.001 and not more than 0.012 in terms of a ratio ($mol_{fatty\ acid}/mol_{metal}$) of the mol number of the fatty acid ($mol_{fatty\ acid}$) to the mol number of metal ($mol_{metal}$) is applied to the surface of the base material.

* * * * *